US008717753B2

(12) United States Patent
Keffeler et al.

(10) Patent No.: US 8,717,753 B2
(45) Date of Patent: May 6, 2014

(54) SELF-LATCHING STORAGE DEVICE MODULE

(75) Inventors: David Michael Keffeler, Niwot, CO (US); Andrew Rudolph Heyd, Longmont, CO (US)

(73) Assignee: Dot Hill Systems Corporation, Longmont, CO (US)

( * ) Notice: Subject to any disclaimer, the term of this patent is extended or adjusted under 35 U.S.C. 154(b) by 192 days.

(21) Appl. No.: 13/347,891

(22) Filed: Jan. 11, 2012

(65) Prior Publication Data
US 2013/0176676 A1  Jul. 11, 2013

(51) Int. Cl.
G06F 1/16  (2006.01)

(52) U.S. Cl.
USPC ............. 361/679.37; 361/679.58; 29/830; 403/327

(58) Field of Classification Search
USPC ................ 361/679.37, 679.38; 403/327
See application file for complete search history.

(56) References Cited

U.S. PATENT DOCUMENTS

| | | | |
|---|---|---|---|
| 1,433,201 A | 10/1922 | Grant | |
| 2,532,981 A | 12/1950 | Wolfe | |
| 4,872,547 A | 10/1989 | Helland | |
| 4,919,403 A | 4/1990 | Bartholomew | |
| 4,927,124 A | 5/1990 | Spedding et al. | |
| 5,013,013 A | 5/1991 | Spedding | |
| 5,216,582 A | 6/1993 | Russell et al. | |
| 5,812,370 A * | 9/1998 | Moore et al. | 361/679.38 |
| 6,193,225 B1 | 2/2001 | Watanabe | |
| 6,327,151 B1 | 12/2001 | Chen et al. | |
| 6,351,374 B1 | 2/2002 | Sherry | |
| 6,643,139 B2 * | 11/2003 | Tien | 361/727 |
| 6,781,789 B2 | 8/2004 | Ostwald | |
| 6,795,309 B2 | 9/2004 | Hartung et al. | |
| 6,834,434 B2 | 12/2004 | Nelson | |
| 7,477,511 B2 * | 1/2009 | Hsu et al. | 361/679.37 |
| 7,535,704 B2 * | 5/2009 | Olesiewicz et al. | 361/679.37 |
| 7,609,511 B2 * | 10/2009 | Peng et al. | 361/679.37 |
| 7,701,707 B2 * | 4/2010 | Peng et al. | 361/679.37 |
| 7,808,777 B2 * | 10/2010 | Luo | 361/679.37 |
| 7,864,522 B1 * | 1/2011 | Peng et al. | 361/679.33 |
| 7,924,557 B2 * | 4/2011 | Li | 361/679.37 |
| 7,974,088 B2 * | 7/2011 | Li | 361/679.37 |
| 8,045,326 B1 * | 10/2011 | Reznikov | 361/679.38 |

(Continued)

OTHER PUBLICATIONS

301 Stainless Steel Product data bulletin, AK Steel, Document 301-B-08-01-07, Jul. 2007.

(Continued)

*Primary Examiner* — Lisa Lea Edmonds
(74) *Attorney, Agent, or Firm* — Thomas J. Lavan

(57) ABSTRACT

A latching device for latching a storage device module into a storage chassis is provided. The latching device includes a latch member having a latching end and a spring end opposite the latching end, the latch member slidingly disposed within a front bezel of the storage device module and being movable between a latching position and a releasing position. The latching device also includes a latch spring between a bearing surface of the front bezel and the spring end of the latch member. The latch spring is in increased compression when the latch member transitions from the latching position to the releasing position, and the latch spring is in decreased compression when the latch member transitions from the releasing position to the latching position. The latching end extends through a latch hole in a side member of the storage chassis for locking the storage device module in the chassis.

22 Claims, 11 Drawing Sheets

Storage device module and chassis support members

Self-latching storage device module components

(56) References Cited

U.S. PATENT DOCUMENTS

| | | | | |
|---|---|---|---|---|
| 8,050,027 B2* | 11/2011 | Liang | ................ | 361/679.37 |
| 8,087,739 B2* | 1/2012 | Chen | ................ | 312/332.1 |
| 8,118,271 B2* | 2/2012 | Peng et al. | ................ | 248/222.11 |
| 8,154,863 B2* | 4/2012 | Yang et al. | ................ | 361/679.38 |
| 8,238,091 B2* | 8/2012 | Chang et al. | ................ | 361/679.39 |
| 8,243,435 B2* | 8/2012 | Li | ................ | 361/679.37 |
| 8,248,775 B2* | 8/2012 | Zhang et al. | ................ | 361/679.33 |
| 8,297,574 B2* | 10/2012 | Zhang et al. | ................ | 248/221.11 |
| 8,358,507 B2* | 1/2013 | Peng et al. | ................ | 361/726 |
| 8,369,080 B2* | 2/2013 | Huang | ................ | 361/679.38 |
| 8,411,429 B2* | 4/2013 | Li | ................ | 361/679.33 |
| 8,456,832 B1* | 6/2013 | Brigham et al. | ................ | 361/679.35 |
| 2005/0013110 A1 | 1/2005 | Shah et al. | | |
| 2006/0017208 A1 | 1/2006 | Bechtold et al. | | |
| 2006/0067042 A1* | 3/2006 | Salinas et al. | ................ | 361/685 |
| 2006/0146492 A1 | 7/2006 | Reents et al. | | |
| 2006/0148295 A1 | 7/2006 | Reents et al. | | |
| 2006/0158834 A1 | 7/2006 | Reents et al. | | |
| 2006/0232923 A1* | 10/2006 | Liang | ................ | 361/685 |
| 2007/0159786 A1* | 7/2007 | Liu et al. | ................ | 361/685 |
| 2007/0211422 A1* | 9/2007 | Liu et al. | ................ | 361/685 |
| 2008/0204994 A1* | 8/2008 | Wang | ................ | 361/685 |
| 2010/0328875 A1 | 12/2010 | Reents et al. | | |
| 2011/0042985 A1 | 2/2011 | Peng et al. | | |
| 2011/0188195 A1* | 8/2011 | Scherf-Smith et al. | ................ | 361/679.37 |
| 2012/0325034 A1 | 12/2012 | Hazama | | |

OTHER PUBLICATIONS

Official Action for U.S. Appl. No. 13/347,924, mailed Oct. 10, 2013.

* cited by examiner

Fig. 1 Representative storage system components
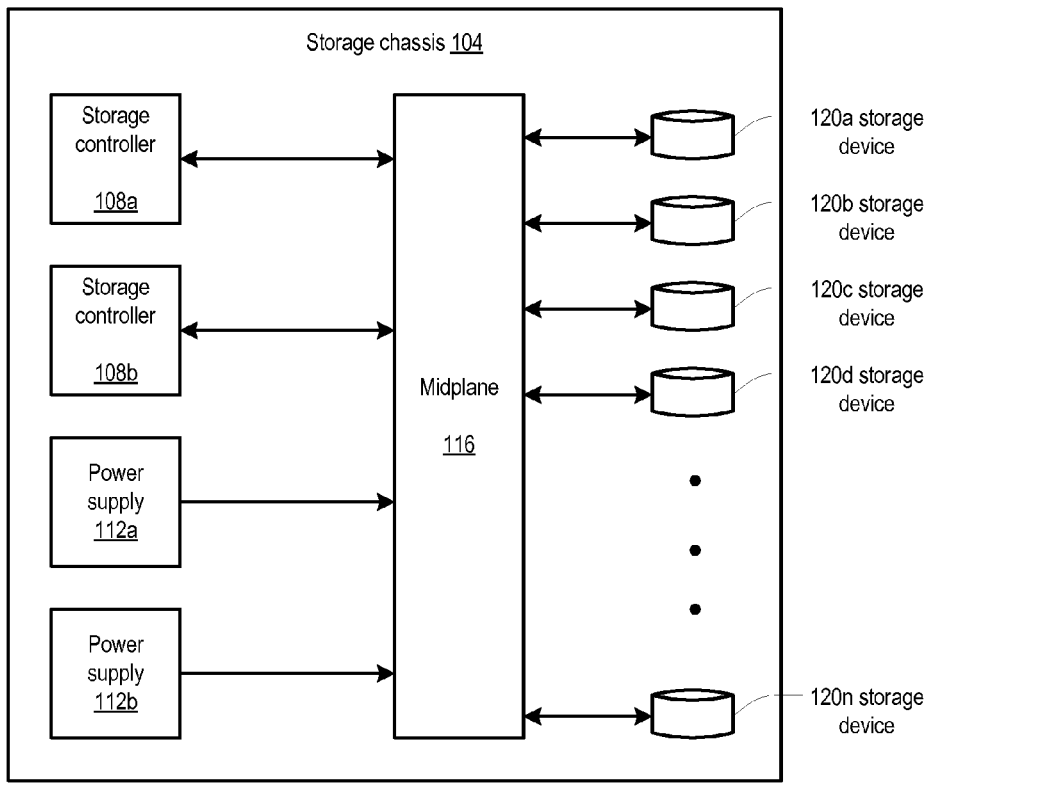

Fig. 2    Storage chassis
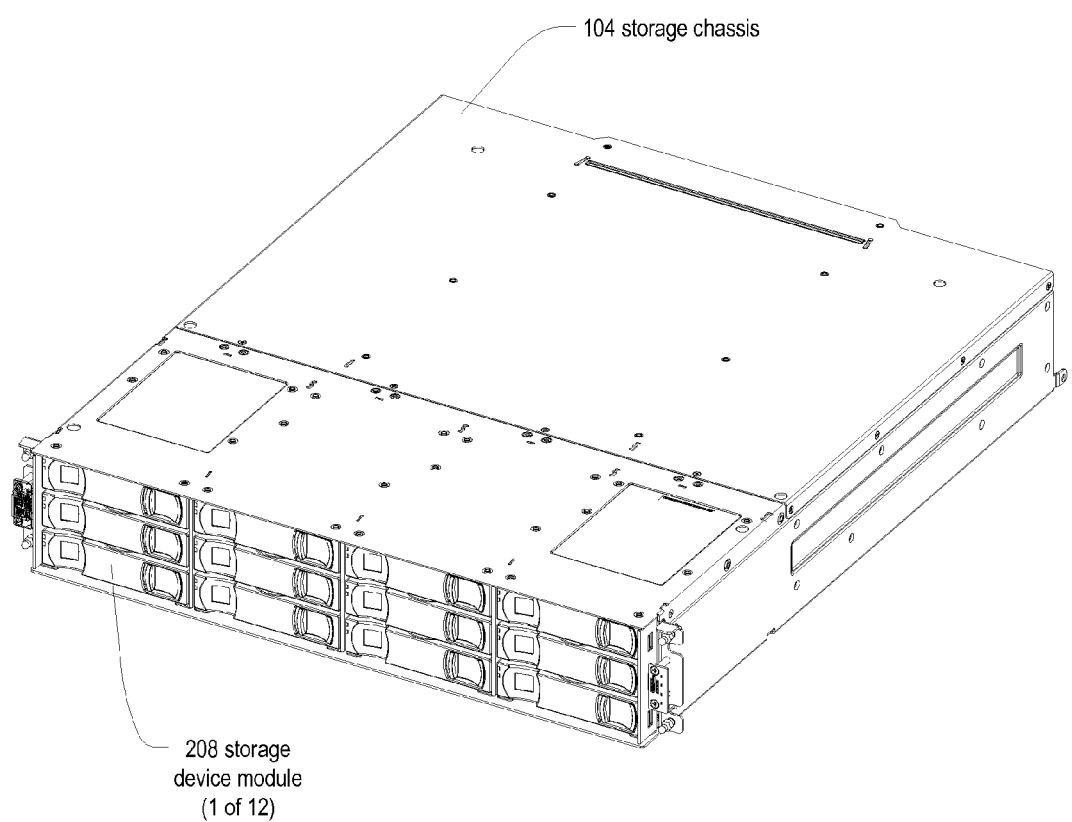

Fig. 3 Storage device module and chassis support members
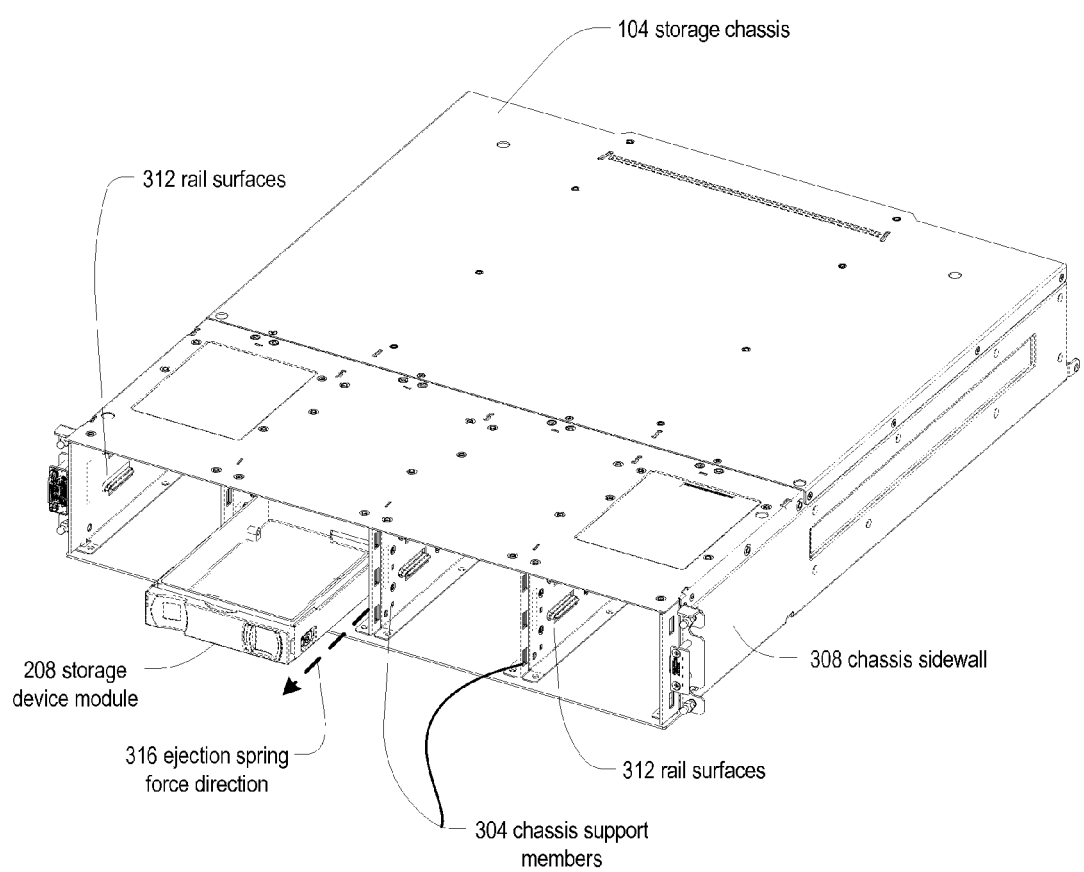

Fig. 4  Assembly of drive ejection springs into first chassis support member
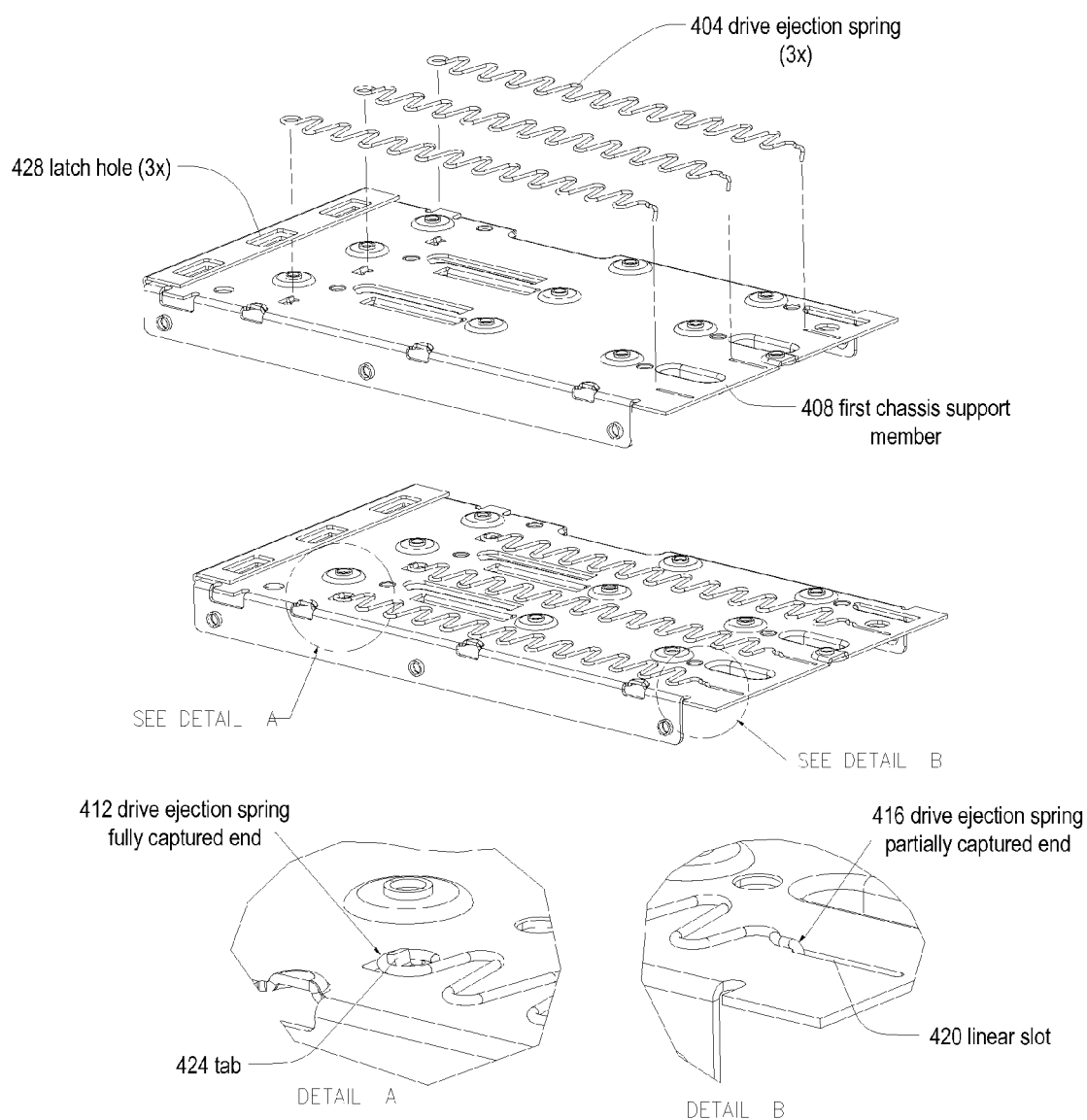

Fig. 5  Assembly of first and second chassis support members
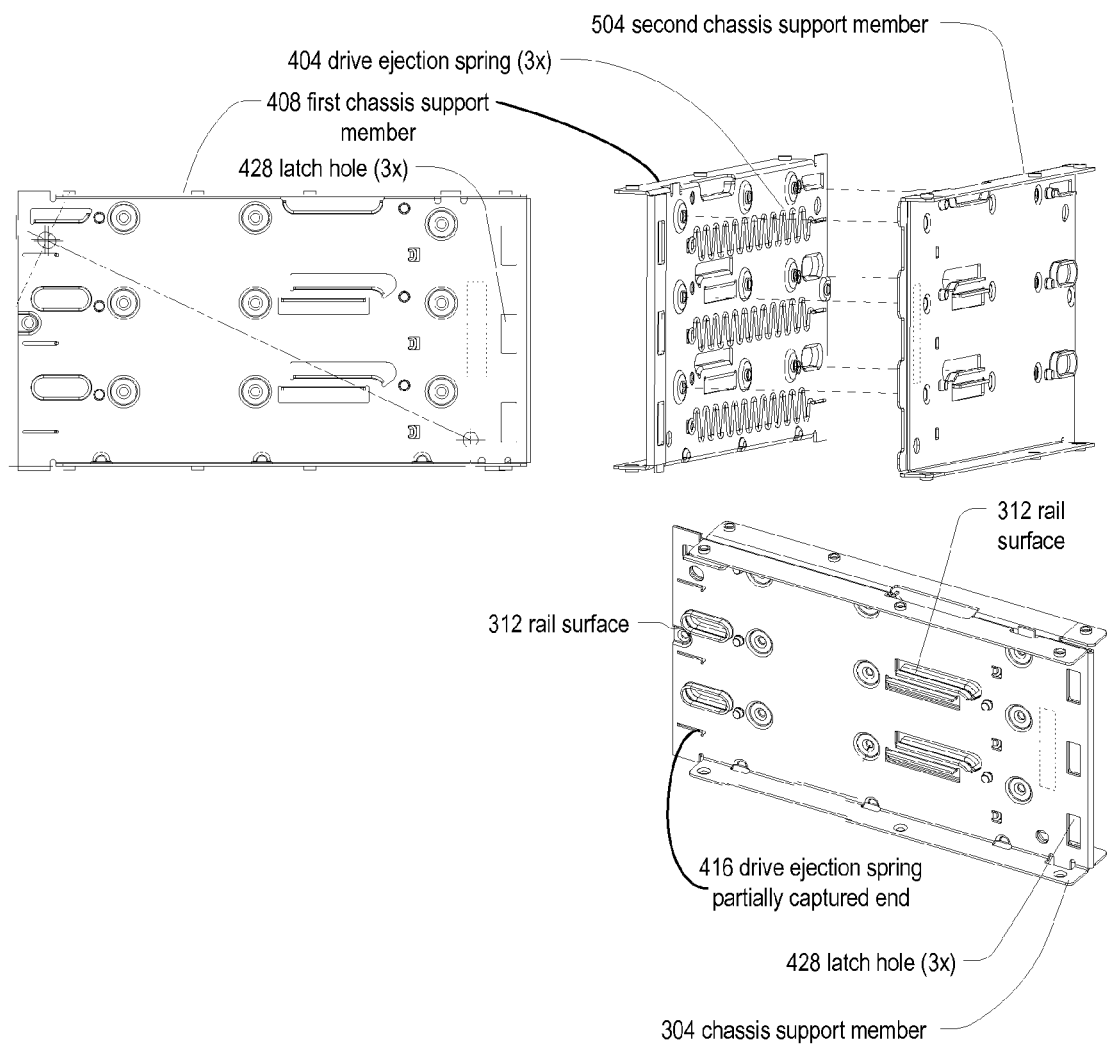

Fig. 6a  Drive ejection spring isometric view
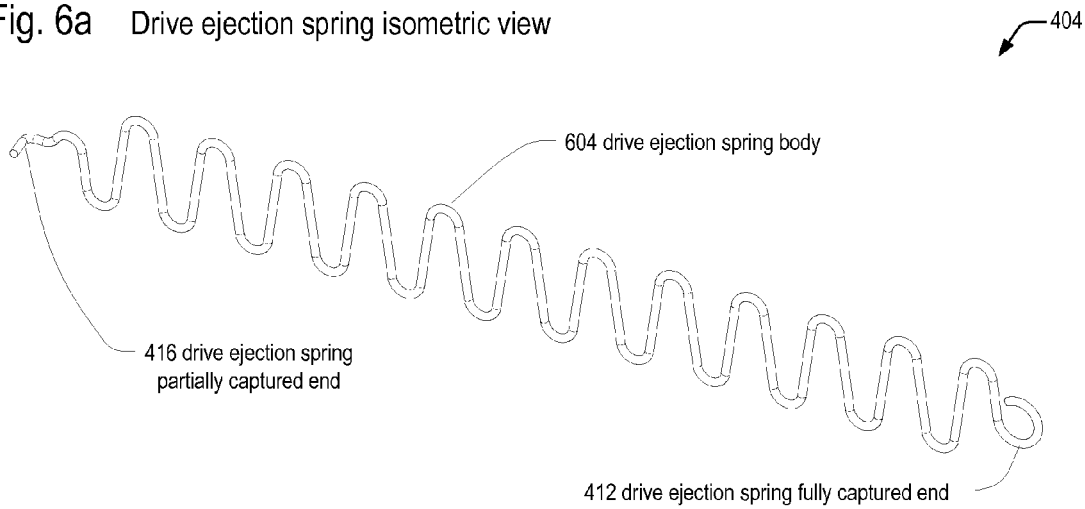
Fig. 6b  Drive ejection spring top view
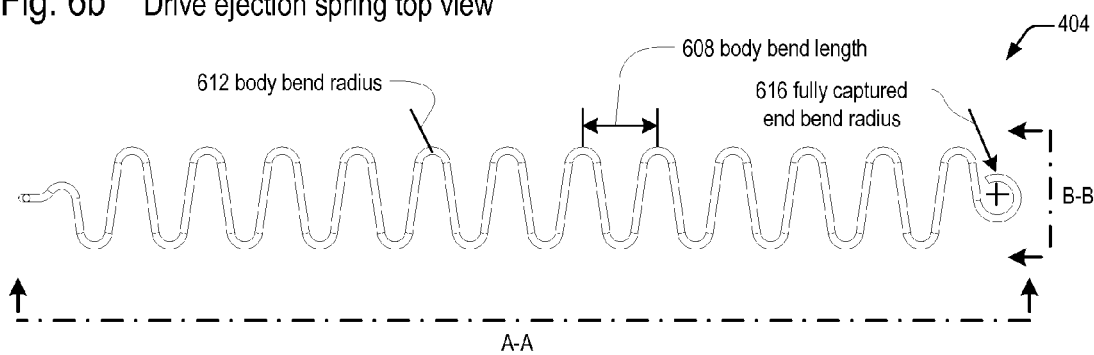
Fig. 6c  Drive ejection spring side view, section A-A
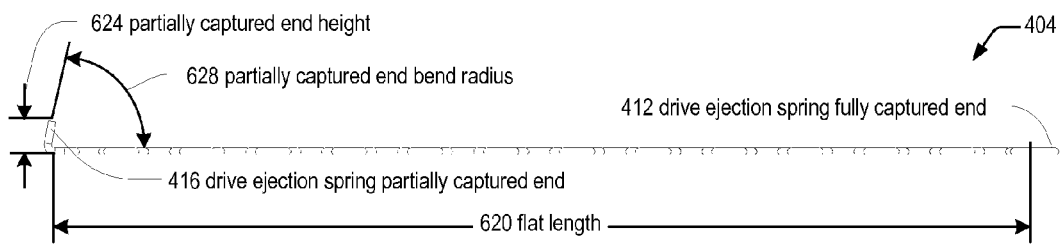
Fig. 6d  Drive ejection spring end view, section B-B
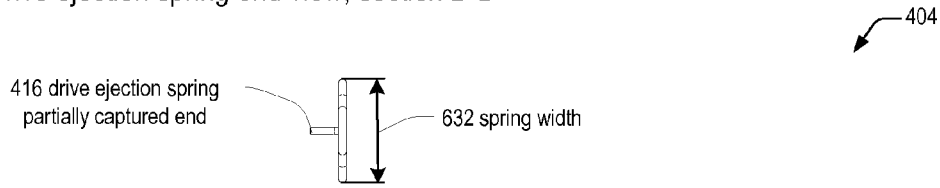

Fig. 7 Self-latching storage device module components
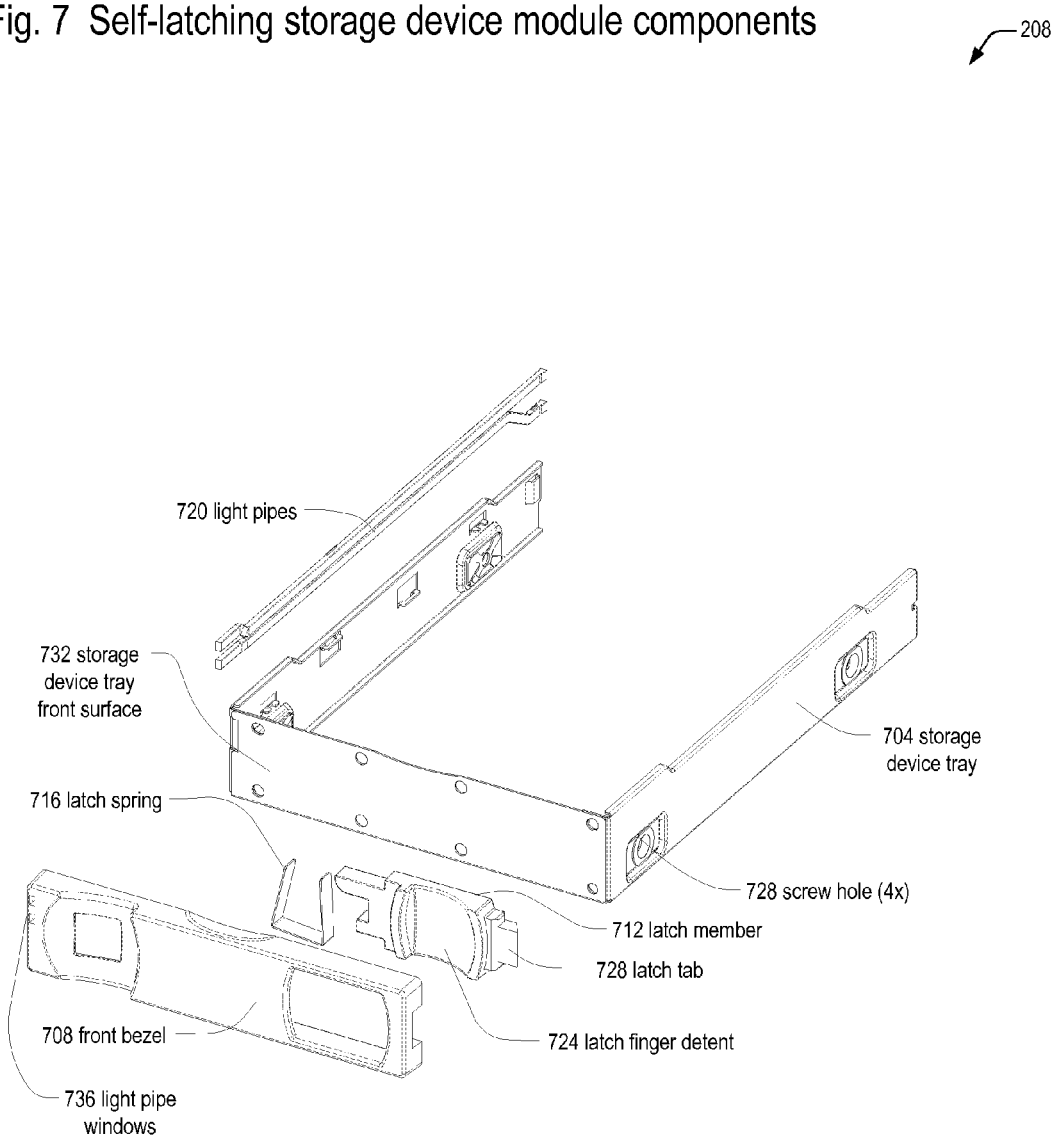

Fig. 8a  Bezel rear view with latch member in latching position
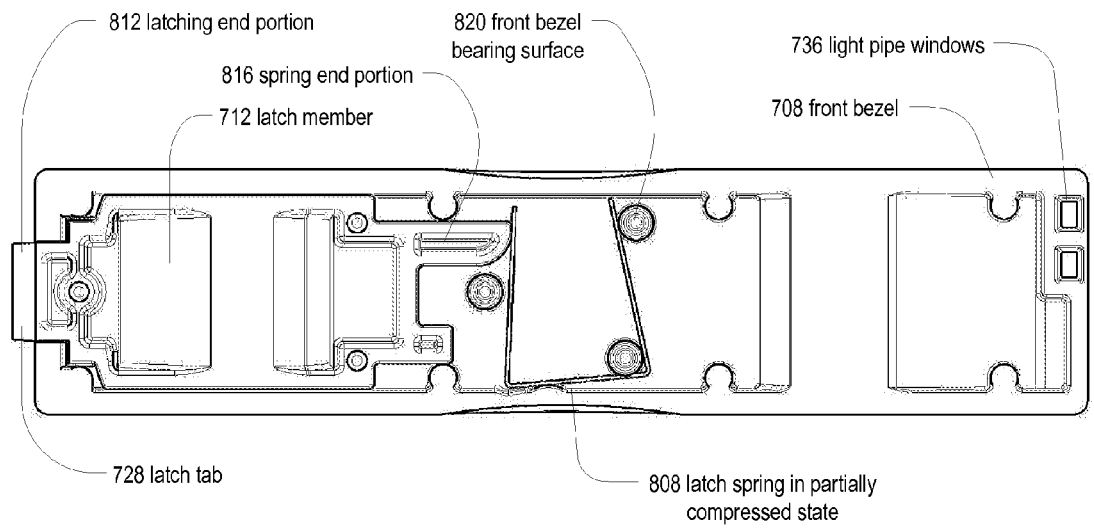
Fig. 8b  Bezel rear view with latch member in releasing position
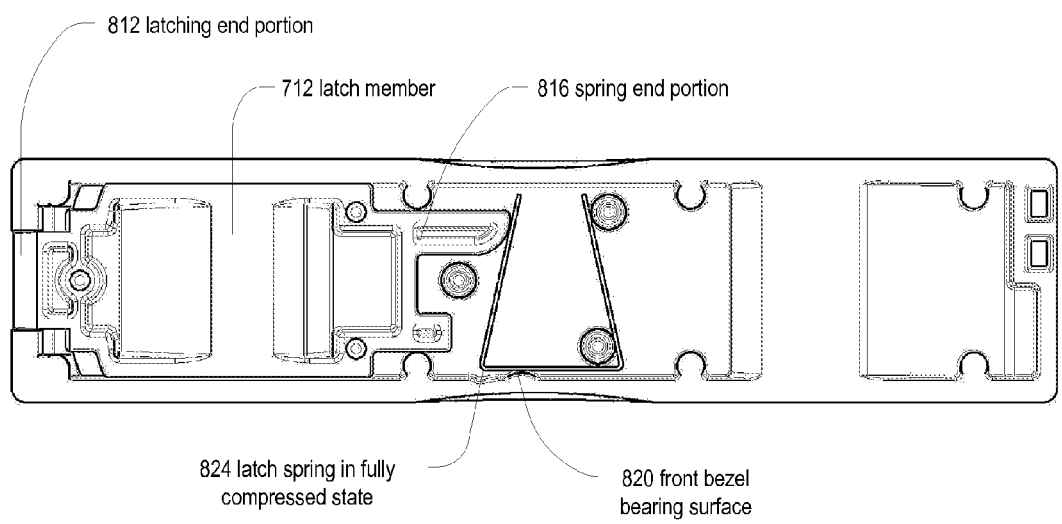

Fig. 9a  Bezel left rear view with latch member in latching position
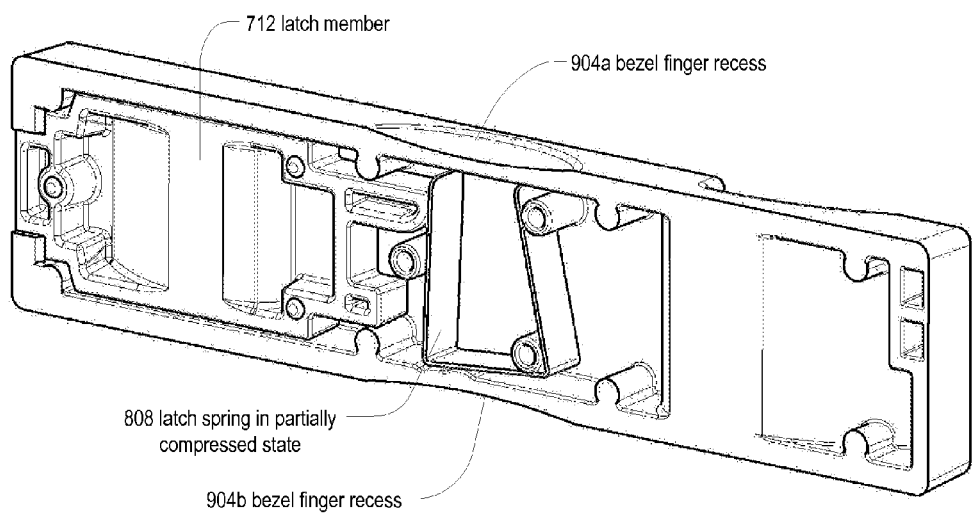
Fig. 9b  Bezel left rear view with latch member in releasing position
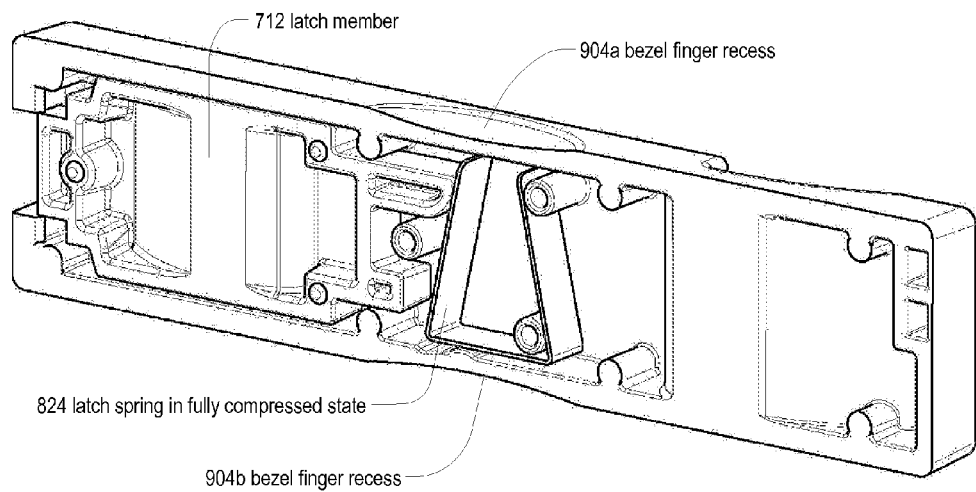

Fig. 10a Bezel right rear view with latch member in latching position
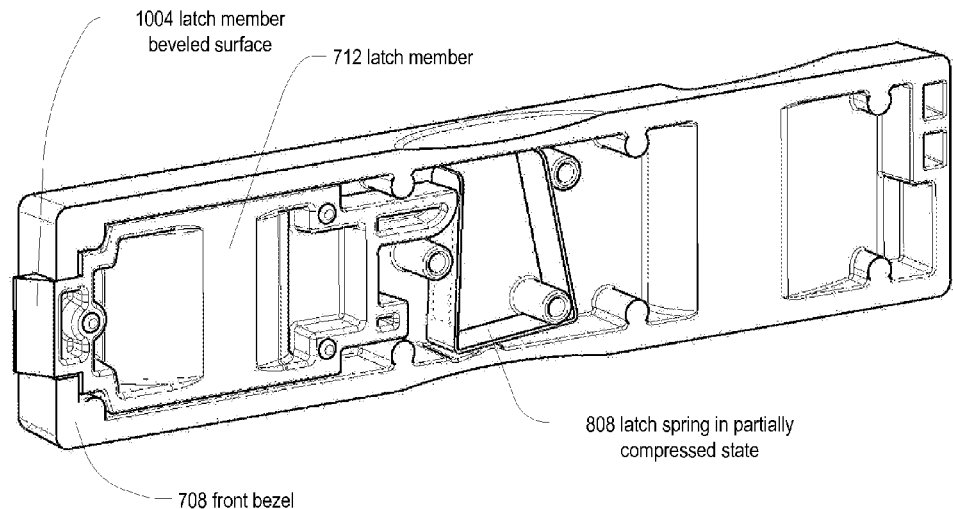
Fig. 10b Bezel right rear view with latch member in releasing position
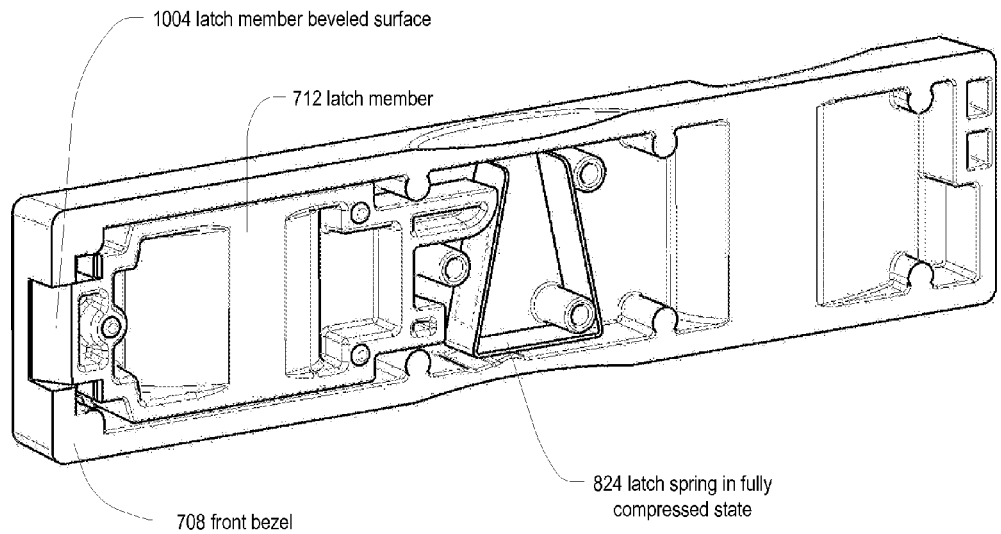

Fig. 11 Assembled self-latching storage device module
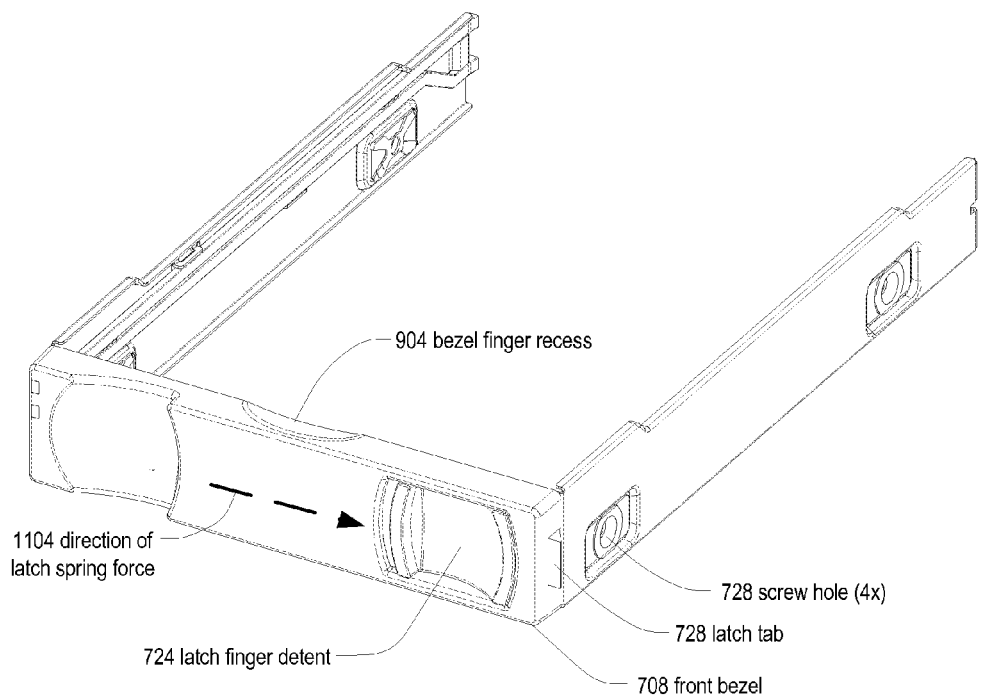

SELF-LATCHING STORAGE DEVICE MODULE

CROSS REFERENCE TO RELATED APPLICATION(S)

This application is related to pending non-Provisional U.S. application Ser. No. 13/347,924 (filed Jan. 11, 2012, entitled STORAGE DEVICE CARRIER EJECTION SPRING inventors Brenden Michael Rust, David Michael David Keffeler, and Andrew Rudolph Heyd).

FIELD

The present invention is directed to computer data storage. In particular, the present invention is directed to a storage device module latch for retaining storage device modules in storage enclosures.

BACKGROUND

Storage subsystems provide system mass storage incorporating many storage devices. Storage devices usually include hard disk drives, but may include solid-state drives, optical drives, or tape drives. Storage subsystems include within a single storage chassis one or more storage devices, power supplies, and possibly one or more storage controllers, including Redundant Array of inexpensive disks (RAID) controllers.

In order to provide non-stop operation, redundant controllers, power supplies, and/or storage devices are often provided in the storage subsystem. Additionally, such assemblies are generally provided as field replaceable modules or FRUs. Field replaceable modules are packaged individually, in order to facilitate removal and replacement of individual controllers, power supplies, or storage devices. Additionally, such modules are often hot replaceable, and able to be replaced while the storage subsystem is powered up and even actively conducting I/O operations to one or more storage devices. Individual storage devices are commonly packaged within a storage device module consisting of a sheet metal tray for mounting the storage device and a front bezel incorporating a latching mechanism, and in some cases visual indicators.

Many storage devices incorporate relatively large and robust midplane connectors, which convey power and I/O signals between the storage device and the midplane. Such connectors often have high pin counts, resulting in high insertion and removal forces. In order to overcome high removal forces, storage device modules incorporate cams, levers, or other mechanically advantaged latch mechanisms.

SUMMARY

The present invention is directed to solving disadvantages of the prior art. In accordance with embodiments of the present invention, a latching device for latching a storage device module into a storage chassis is provided. The storage chassis confines an open-ended receiving space that extends in a first direction and that receives slidably and removably the storage device module therein. The storage chassis has a wall comprising a latch hole that borders the receiving space. The latching device includes a latch member having a latching end portion and a spring end portion opposite the latching end portion. The latch member is slidingly disposed within a front bezel of the storage device module and is movable in a second direction transverse to the first direction between a latching position and a releasing position. The latching end portion of the latch member in the latching position extends through the latch hole for locking the storage device module into the storage chassis. The latching end portion of the latch member in the releasing position is extracted from the latch hole thereby permitting the removal of the storage device module from the receiving space. The latching device also includes a spring member for providing spring force in the second direction and disposed within the front bezel between a bearing surface of the front bezel and the spring end portion of the latch member. The spring member is in increased compression when the latch member transitions from the latching position to the releasing position. The spring member is in decreased compression when the latch member transitions from the releasing position to the latching position.

In accordance with another embodiment of the present invention, a storage device module for providing independent insertion and removal of a storage device in a storage chassis is provided. The storage device module includes a tray, slidingly engaged in a first direction to one or more storage chassis surfaces forming a receiving space that receives the storage device module therein and a bezel, forming a front surface of the storage device module and fastened to the tray. The bezel includes a latch. The latch includes a latching end portion and a spring end portion, opposite the latching end portion. The latch is finger-movable in a second direction transverse to the first direction between a latching position and a releasing position. In the latching position, the latching end portion of the latch extends through a latch hole in one of the one or more storage chassis surfaces for locking the storage device module into the storage chassis. In the releasing position, the latching end portion of the latch is not engaged with the latch hole. The latch in the releasing position unlocks the storage device module from the storage chassis and permits the removal of the storage device module from the receiving space. The latch also includes a latch spring for providing force in the second direction and disposed within the bezel between a bearing surface of the bezel and the spring end portion of the latch member. The latch spring is in an increased compression state when the latch member transitions from the latching position to the releasing position. The latch spring is in a decreased compression state when the latch member transitions from the releasing position to the latching position.

In accordance with another embodiment of the present invention, a method for inserting a storage device module into a receiving space of a storage chassis is provided. The method includes positioning the storage device module in alignment with the receiving space such that a faceplate assembly of the storage device module is oriented on a side of the storage device module opposite the receiving space and a top surface of the storage device module faces the top of the receiving space, moving the storage device module into the receiving space until a latching end portion of a latch member in the faceplate assembly makes contact with a side surface of the storage chassis, the latch member comprising the latching end portion and a spring end portion opposite the latching end portion, and pushing the storage device module fully into the receiving space. The latching end portion engages a latch hole in a side interior surface of the storage chassis bordering the receiving space of the storage chassis when the storage device module is fully pushed into the receiving space.

In accordance with yet another embodiment of the present invention, a method for removing a storage device module from a receiving space of a storage chassis is provided. The method includes sliding a latch member in a second direction, the latch member including a latching end portion and a spring end portion opposite the latching end portion. The latching end portion engages a latch hole in a storage chassis interior surface bordering the receiving space prior to sliding the latch member, and disengages the latch hole while sliding the latch member. A latch spring in contact with the spring end portion provides a force opposite to the second direction. The method also includes pushing the storage device module out of the receiving space by an ejection spring providing force in a first direction between the storage chassis and the storage device module and orthogonal to the second direction. The ejection spring pushes the storage device module a first predetermined distance in the first direction after the latching end portion disengages the latch hole. The method further includes grabbing the storage device module by a bezel finger recess of a faceplate assembly, and pulling the storage device module from the receiving space of the storage chassis. The faceplate assembly forms a front surface of the storage device module.

An advantage of the present invention is it allows a simpler and less costly storage device module latch to be used for storage device module ejection, compared to conventional approaches. Conventional storage device latches require mechanical advantage to overcome midplane or backplane connector insertion and removal forces. In order to provide the required mechanical advantage, conventional storage device latches include levers or rotating cams that bear against a storage chassis surface bordering the storage device module.

Another advantage of the present invention is it restricts all storage device module latch movement within the envelope of the bezel of the storage device module. Less physical space in front of the storage device module and storage chassis is required since no cam levers or other mechanical structures are required in order to insert or remove a storage device module from a storage chassis.

Additional features and advantages of embodiments of the present invention will become more readily apparent from the following description, particularly when taken together with the accompanying drawings.

BRIEF DESCRIPTION OF THE DRAWINGS

FIG. 1 is a block diagram illustrating representative components of a storage system in accordance with embodiments of the present invention.

FIG. 2 is a diagram illustrating a storage chassis comprising a storage subsystem in accordance with embodiments of the present invention.

FIG. 3 is a diagram illustrating a storage device module and selected internal features of a storage chassis in accordance with embodiments of the present invention.

FIG. 4 is a diagram illustrating assembly of drive ejection springs into a first chassis support member in accordance with the present invention.

FIG. 5 is a diagram illustrating assembly of first and second chassis support members in accordance with the present invention.

FIG. 6a is a diagram illustrating a drive ejection spring isometric view in accordance with the present invention.

FIG. 6b is a diagram illustrating a drive ejection spring top view in accordance with the present invention.

FIG. 6c is a diagram illustrating a drive ejection spring side view, section A-A, in accordance with the present invention.

FIG. 6d is a diagram illustrating a drive ejection spring end view, section B-B, in accordance with the present invention.

FIG. 7 is a diagram illustrating self-latching storage device module components, in accordance with the preferred embodiment of the present invention.

FIG. 8a is a diagram illustrating a bezel rear view with a latch member in a latching position, in accordance with the preferred embodiment of the present invention.

FIG. 8b is a diagram illustrating a bezel rear view with a latch member in a releasing position, in accordance with the preferred embodiment of the present invention.

FIG. 9a is a diagram illustrating a bezel left rear view with a latch member in a latching position, in accordance with the preferred embodiment of the present invention.

FIG. 9b is a diagram illustrating a bezel left rear view with a latch member in a releasing position, in accordance with the preferred embodiment of the present invention.

FIG. 10a is a diagram illustrating a bezel right rear view with a latch member in a latching position, in accordance with the preferred embodiment of the present invention.

FIG. 10b is a diagram illustrating a bezel right rear view with a latch member in a releasing position, in accordance with the preferred embodiment of the present invention.

FIG. 11 is a diagram illustrating an assembled self-latching storage device module, in accordance with the preferred embodiment of the present invention.

DETAILED DESCRIPTION

The present invention is directed to the problem of eliminating bulky storage device ejection components in storage subsystems where low-insertion force storage device midplane connectors are being used.

Referring now to FIG. 1, a block diagram illustrating representative components of a storage system 100 in accordance with embodiments of the present invention is shown. Storage subsystem 100 includes storage chassis 104. Storage system 100 may include multiple storage chassis 104, or a single storage chassis 104. Storage chassis 104 is generally, but not necessarily, a sheet metal cabinet enclosing multiple assemblies. In some embodiments, the assemblies are individually packaged in sheet metal or plastic enclosures, and are designed with hot pluggable and/or redundant operation in mind.

Storage chassis 104 includes one or more storage devices 120, shown in FIG. 1 as storage device 120a through 120n. Storage devices 120 include hard disk drives, solid state drives, optical drives, and tape drives. Each storage device 120 is packaged in a storage device module that allows one or more storage devices 120 to be removed or replaced within storage chassis 104.

Storage chassis 104 includes a midplane 116, which provides interconnectivity between the various modules within storage chassis 104. Midplane 116 is the only assembly fixed within storage chassis 104, and is therefore often only designed with passive circuitry to increase reliability and reduce the need for replacement. Midplane 116 provides power and signal interconnectivity between storage controllers 108, power supplies 112, and storage devices 120.

Storage chassis 104 includes one or more power supplies 112, shown as power supply 112a and power supply 112b. Power supplies 112 are designed such that any one power supply 112 may power all assemblies included in storage chassis 104, even if another power supply 112 has failed.

Storage chassis 104 may optionally include one or more storage controllers 108, shown as storage controller 108a and storage controller 108b. Storage controllers 108 are usually implemented as redundant storage controllers 108, allowing any one storage controller 108 to control all storage devices 120 even if another storage controller 108 has failed. Storage controllers 108 often include redundant array of inexpensive desk (RAID) technology to provide additional redundancy and performance when accessing groups of storage devices 120. In some embodiments, storage chassis 104 includes no storage controllers 108a, such as in a JBOD storage chassis 104. JBOD storage chassis 104 are usually expansion storage chassis 104, in order to provide a greater number of storage devices 120 in storage system 100.

Referring now to FIG. 2, a diagram illustrating a storage chassis 104 comprising a storage subsystem in accordance with embodiments of the present invention is shown.

In order to obtain a high degree of packaging efficiency when including multiple storage chassis 104 in storage system 100, storage chassis 104 is often designed as a rack-mountable storage enclosure. Multiple rack-mountable storage enclosures are able to be mounted in a single 19 inch rack. Storage chassis 104 is therefore often designed in increments of rack units to allow efficient stacking within a 19 inch rack. In one embodiment, storage chassis 104 is two rack units high. In other embodiments, storage chassis 104 is less or more than two rack units high.

Storage chassis 104 includes multiple storage device modules 208. In one embodiment, storage chassis 104 includes 12 storage device modules 208. In other embodiments, storage chassis 104 includes less than or more than 12 storage device modules 208. In one embodiment each storage device module 208 includes one storage device 120. In another embodiment, each storage device module 208 includes two or more storage devices 120. In some embodiments, storage device modules 208 do not include any storage devices 120. Such would be the case in a partially populated storage chassis 104 that included the ability to expand storage capacity by adding additional storage devices 120 in the future.

Although storage chassis 104 includes one or more power supplies 112 and possibly one or more storage controllers 108, these assemblies are not specifically shown in FIG. 2 but should be generally understood to be present.

Referring now to FIG. 3, a diagram illustrating a storage device module 208 and selected internal features of a storage chassis 104 in accordance with embodiments of the present invention is shown.

Storage device modules 208 are designed to allow user insertion and/or removal of any storage device module 208 into an open-ended receiving space of a storage chassis 104. Storage device modules 208 are removed from the storage chassis 104 in a first direction, which is the same as direction 316 of FIG. 3.

Storage device module 208 removal is required in order to service any storage devices 120 in storage device module 208, or to add a storage device 120 to storage device module 208. In many embodiments, storage device module 208 is designed to be hot-pluggable within storage chassis 104. Hot-plugging allows storage device module 208 to be inserted or removed from storage chassis 104 with power on.

Chassis support members 304 are provided in storage chassis 104 to compartmentalize storage chassis 104 in order to support multiple storage device modules 208. Chassis support members 304 also provide support for top and bottom surfaces of storage chassis 104, thereby improving storage chassis 104 structural integrity.

In order to make storage device modules 208 hot-pluggable, rail systems are built into storage chassis 104. Rail surfaces 312 are provided on chassis sidewalls 308 and chassis support members 304 allow storage device modules 208 to slide within storage chassis 104.

Generations of storage devices 120 have required relatively high insertion forces. Part of the reason for this are high connector pin counts on storage devices 120 required to support many power, ground, and parallel bus signal interconnections. In many cases, storage devices 120 included separate power and signal I/O connectors—which contribute to higher storage device 120 insertion and removal forces. For example, the 4-contact Molex-style power connector used with IDE and parallel SCSI storage devices 120 requires up to 6 lbs for removal force and 16 lbs for insertion. VHDCI connectors used for parallel SCSI storage devices 120 require 8.25 lb for insertion and 2.29 lb for removal. SCA-2 connectors require 7.9 lb for insertion and 1.32 lb for removal.

As storage devices 120 evolved, manufacturers have similarly evolved midplane storage device 120 connectors. Lower power circuitry on storage devices 120 means that fewer power and ground I/O connections are required, and smaller and more efficient connector contacts may be used. Also, storage devices 120 have reduced pin counts due to more efficient serial signal I/O, such as that provided in Fiberchannel, SATA, and SAS technologies. As a result, midplane 116 or backplane connectors are smaller, lighter, and require significantly lower insertion and removal forces than previous generation storage devices 120. For example, SAS 2.0 connectors for storage devices 120 require 4.5 lbs insertion force and 0.56 lbs removal force.

Referring now to FIG. 4, a diagram illustrating assembly of drive ejection springs 404 into a first chassis support member 408 in accordance with the preferred embodiment of the present invention is shown. The drive ejection spring 404 of the present invention exerts a force between 4 and 6 pounds against the storage device module 208 when the storage device module 208 is fully inserted in the storage chassis 104. Drive ejection springs 404 exert force against the storage device module 208 out the front of the storage chassis 104, or as illustrated in FIG. 3 as ejection spring force direction 316.

In one embodiment, each chassis support member 304 includes a first chassis support member 408, and three drive ejection springs 404. One drive ejection spring 404 is provided for each storage device module 208. In alternative embodiments, multiple drive ejection springs 404 may be provided for each storage device module 208. In one embodiment, multiple drive ejection springs 404 are provided for each storage device module 208 in the same first chassis support member 408. In another embodiment, multiple drive ejection springs 404 are provided for each storage device module 208 in different first chassis support members 408.

Drive ejection springs 404 are described in more detail in FIGS. 6a-6d. In one embodiment, a tab 424 is bent within first chassis support member 408 in order to create a fixed attachment point for a drive ejection spring fully captured end 412. In other embodiments, the drive ejection spring fully captured and 412 is secured to the first chassis support member 408 with any suitable attachment component, including but not limited to, a screw, a bolt, a rivet, or a weld.

In one embodiment, a linear slot 420 is provided within first chassis support member 408 in order to provide a means of partially capturing a free end of drive ejection spring 404. A drive ejection spring partially captured end 416 passes through linear slot 420 to engage a rear surface of storage device module 208. Linear slot 420 is oriented in order to allow linear movement of the drive ejection spring partially captured end 416 in concert with an inserted storage device module 208, and prevent linear movement of the drive ejection spring partially captured end 416 in an up or down direction with reference to storage chassis 104.

Referring now to FIG. 5, a diagram illustrating assembly of first 408 and second 504 chassis support members in accordance with an embodiment of the present invention is shown. Chassis support members 304 are an assembly including first chassis support member 408, second chassis support member 504, and drive ejection springs 404. In one embodiment, there are three drive ejection springs 404 in each chassis support member 304, located between first chassis support member 408 and second chassis support member 504. By locating drive ejection springs 404 between first chassis support member 408 and second chassis support member 504, drive ejection springs 404 are protected from damage. In other embodiments, there may be less than or more than three drive ejection springs 404.

Drive ejection springs 404 in one embodiment are held captive between first chassis support member 408 and second chassis support member 504. Rail surfaces 312 are provided on both the first chassis support member 408 and the second chassis support member 504 to support storage device modules 208 on each side of a chassis support member 304.

When a storage device module 208 is inserted into storage chassis 104, storage device module 208 engages rail surfaces 312 on either side of storage device module 208. As the storage device module 208 is pushed further into storage chassis 104, before the storage device module 208 is fully seated, storage device module 208 engages and pushes against drive ejection spring partially captured end 416. Pushing storage device module 208 further into storage chassis 104 causes drive ejection spring 404 to linearly expand and exert force against the rear surface of storage device module 208. Pushing storage device module 208 fully into storage chassis 104 causes an electrical connector on the storage device 120 in storage device module 208 to engage a mating connector on midplane 116 of storage chassis 104, and a latch tab 728 in storage device module 208 to engage a mating latch hole 428 in either chassis support member 304 or chassis sidewall 308. The drive ejection spring 404 remains in an expanded state, exerting force against the rear of storage device module 208, until such time as the latch member 712 in storage device module 208 is released. Once the latch member 712 in storage device module 208 is released, stored spring force in expanded drive ejection spring 404 moves storage device module 208 out the front of storage chassis 104 a second predetermined distance where the storage device module 208 comes to rest. In a preferred embodiment, the second predetermined distance is 9.5 mm. In other embodiments, the second predetermined distance may be less than or greater than 9.5 mm. However, the predetermined distance is at least 5 mm.

Referring now to FIG. 6a, a diagram illustrating a drive ejection spring 404 isometric view in accordance with an embodiment of the present invention is shown.

Drive ejection spring 404 includes three parts: a drive ejection spring body 604, a drive ejection spring fully captured end 412, and a drive ejection spring partially captured and 416. In one embodiment, all three portions of drive ejection spring 404 are formed from a single length of suitable material. In the preferred embodiment, drive ejection spring 404 is formed from 0.796 mm+/−0.010 mm SWIC-F pre-coated post-plated Nickel ASTM A228 steel music wire, and is stress-relieved after forming. The drive ejection spring 404 has yield strength after stress relieving of 2,400 MPa, or 350,000 PSI, minimum. In other embodiments, drive ejection spring 404 may be formed from Beryllium copper, phosphor bronze, or Titanium.

In the preferred embodiment of the present invention, the drive ejection spring fully captured end 412 is formed into a loop, where the loop is in the same plane as the drive ejection spring body 604. In other embodiments, the drive ejection spring fully captured end 412 may be formed into other suitable shapes to facilitate fastening to the first chassis support member 408.

Referring now to FIG. 6b, a diagram illustrating a drive ejection spring 404 top view in accordance with an embodiment of the present invention is shown.

In the preferred embodiment, various dimensions of drive ejection spring 404 are illustrated. The body bend length 608 is typically 8.0 mm, the fully captured end bend radius 616 is 3.5 mm, and the body bend radius 612 is 1.1 mm for each of 24 serpentine bends.

Referring now to FIG. 6c, a diagram illustrating a drive ejection spring 404 side view, section A-A, in accordance with an embodiment of the present invention is shown.

In the preferred embodiment, various dimensions of drive ejection spring 404 are illustrated. The flat length 620 (free length) is 103.44 mm+/−4.0 mm from the center of the loop in the fully captured end 412 to the start of the bend in the partially captured end 416. The partially captured end height 624 is 3.3 mm, and the partially captured end bend radius 628 is 80 degrees. Once the complete storage chassis 104 is assembled, the drive ejection spring 404 stretches to a maximum length of 109.5 mm, with 6.1 mm of preload extension, when a storage device module 208 is not inserted into the storage chassis 104. When a storage device module 208 is fully inserted into the storage chassis 104, the drive ejection spring 404 stretches to a length of 118.9 mm.

Referring now to FIG. 6d, a diagram illustrating a drive ejection spring 404 end view, section B-B, in accordance with an embodiment of the present invention is shown. In the preferred embodiment, the spring width 632 is 10.8 mm. Referring now to FIG. 7, a diagram illustrating self-latching storage device module components, in accordance with the preferred embodiment of the present invention is shown. The self-latching storage device module 208 includes several components that allow a storage device 120 to be securely mounted in the self-latching storage device module 208.

The self-latching storage device module 208 includes a storage device tray 704, or tray 704. Storage devices 120 mount to the storage device tray 704 with various fasteners. In the preferred embodiment, the storage device tray 704 includes four screw holes 728 for attaching a storage device 120 to the storage device tray 704 through side surfaces of the storage device 120. When mounted in the storage device tray 704, the storage device power and signal connectors face the rear of the self-latching storage device module 208, opposite the storage device tray front surface 732.

The self-latching storage device module 208 also includes a front bezel 708, which securely attaches to the storage device tray front surface 732. The front bezel 708 provides a faceplate for the self-latching storage device module 208, and includes a finger-activated latch member 712. The latch member 712 slides horizontally in a second direction within the front bezel 708, and is captured within the front bezel 708. The second direction is either the direction of spring latch force 1104 illustrated in FIG. 11, when latching the storage device module 208, or opposite of direction 1104 when releasing the storage device module 208.

The latch member 712 includes a latch tab 728, which engages a latch hole 428 in a chassis support member 304 to lock the self-latching storage device module 208 into the storage chassis 104. The latch member 712 also includes a latch finger detent 724.

The front bezel 708 also includes a latch spring 716. When unmounted in the front bezel 708, the latch spring 716 is in an uncompressed state. In a preferred embodiment, the latch spring 716 is formed from a single piece of 0.40 millimeter (mm) spring steel, 301 series stainless steel, or equivalent, ¾ hardness material or equivalent, and exerts a force of between 0.5 lbs and 0.75 lbs, preferably 0.60 lbs, against the latch member 712 in the latching position and between 0.6 lbs and 1.0 lbs, preferably 0.83 lbs, against the latch member 712 in the releasing position. The latch finger detent 724 provides a finger engagement surface by which a user can move the latch member 712 to overcome spring force exerted by latch spring 716 to disengage the latch tab 728 from the latch hole 428.

In some embodiments, the self-latching storage device module 208 includes one or more light pipes 720, which convey light energy from LEDs mounted inside the storage chassis 104 to light pipe windows 736 on the front bezel 708.

The self-latching storage device module 208 is installable in storage chassis 104 by only pushing the self-latching storage device module 208 directly into the storage chassis 104. It is not required to manually actuate the latch member 712 or any other device in either the self-latching storage device module 208 or the storage chassis 104 during such insertion operations. The self-latching storage device module 208 is pushed into the storage chassis 104 a first predetermined distance, at which point a beveled surface of the latch tab 728 makes initial contact with a chassis support member 304. Therefore, the first predetermined distance is the distance from the rear of midplane 116 connectors of storage device 120 mounted in self-latching storage device module 208 to the rear surface of latch member beveled surface 1004 of latch tab 728, when the latch member 712 is in the latching position as illustrated in FIG. 10a.

Referring now to FIG. 8a is a diagram illustrating a bezel rear view with a latch member 712 in a latching position, in accordance with the preferred embodiment of the present invention is shown. FIGS. 8a, 8b, 9a, 9b, 10a, and 10b provide various views of an assembled front bezel 708 in order to illustrate the cooperation between the front bezel 708, the latch member 712, and the latch spring 716.

FIG. 8a illustrates an assembled bezel in an at-rest position. The latch member 712 has a latching end portion 812, and a spring end portion 816. The latching end portion 812 includes the latch tab 728, which extends through the side of front bezel 708 when in the latching position in order to engage a latch hole 428. Opposite the latching end portion 812 of the latch member 712 is the spring end portion 816.

The front bezel 708 includes features to capture the latch member 712 in a vertical direction, and only allow side-to-side movement. The front bezel 708 also includes features to limit the side-to-side movement in each direction.

The latch spring 716 is installed in such a way as to bear against a front bezel bearing surface 820, and a spring end portion 816 of the latch member 712. When installed in the front bezel 708 and the latch member 712 in the latching position, the latch spring is in a partially compressed state 808. That is, the latch spring 716 provides sufficient force against the spring end portion 816 of the latch member 712 to cause the latch tab 728 to protrude from the side of the front bezel 708.

Referring now to FIG. 8b, a diagram illustrating a bezel rear view with a latch member 712 in a releasing position, in accordance with the preferred embodiment of the present invention is shown. FIG. 8b illustrates an assembled bezel in an actuated position. The actuated position reflects an orientation of the latch member 712 and latch spring 716 when a user exerts force in opposition to the latch spring 716 against the latch finger detent 724.

The exerted force causes the latch member 712 to horizontally move toward the center of the front bezel 708, which disengages the latch tab 728 from the latch hole 428. As the latch member 712 horizontally moves toward the center of the front bezel 708, the spring end portion 816 pushes against one end of the latch spring 716, causing the latch spring 716 to be in a fully compressed state 824.

Referring now to FIG. 9a, a diagram illustrating a bezel left rear view with a latch member 712 in a latching position, in accordance with the preferred embodiment of the present invention is shown. FIG. 9a shows the same operation illustrated in FIG. 8a, but provides an alternative view of the latch spring in the partially compressed state 808.

Referring now to FIG. 9b, a diagram illustrating a bezel left rear view with a latch member 712 in a releasing position, in accordance with the preferred embodiment of the present invention is shown. FIG. 9b shows the same operation illustrated in FIG. 8b, but provides an alternative view of the latch spring in the fully compressed state 824.

The front bezel 708 includes a bezel finger recess in the top 904a and/or bottom 904b surfaces. The bezel finger recess 904a, 904b is a recessed area that provides user finger purchase in order to extract the self-latching storage device module 208 from the storage chassis 104. After a user moves the latch member 712 to the releasing position, one or more drive ejection springs 404 exerts force against the storage device tray 704, and ejects the self-latching storage device module 208 a short distance. In the preferred embodiment, the ejection distance, or second predetermined distance, is approximately 9.5 mm. Once the self-latching storage device module 208 is ejected, a user is able to grab the front bezel 708 by the bezel finger recess 904a, 904b and pull the self-latching storage device module 208 from the storage chassis 104.

Referring now to FIG. 10a, a diagram illustrating a bezel right rear view with a latch member 712 in a latching position, in accordance with the preferred embodiment of the present invention is shown. FIG. 10a shows the same operation illustrated in FIGS. 9a and 8a, but provides an alternative view of the latch spring in the partially compressed state 808.

The latch tab 728 includes a latch member beveled surface 1004. The latch tab 728 is beveled on the rear surface in order to provide simple insertion and locking of the self-latching storage device module 208 in the storage chassis 104. In the latching position, the latch member beveled surface 1004 protrudes from the front bezel 708.

When the self-latching storage device module 208 is pushed within a receiving space of the storage chassis 104, the latch member beveled surface 1004 will make initial contact with a front surface of a chassis support member 304. When the self-latching storage device module 208 is pushed further into the storage chassis 104, the latch member beveled surface 1004 will push against the chassis support member 304, thereby pushing the latch member 712 toward the center of the front bezel 708 and compressing the latch spring 716. Once the latch tab 728 is fully registered with the latch hole 428, the latch spring in the fully compressed state 824 will exert force against the spring end portion 816 of the latch member 712. This will cause the latch tab 728 to move into the latch hole 428, thereby locking the self-latching storage device module 208 into the storage chassis 104.

Referring now to FIG. 10b, a diagram illustrating a bezel right rear view with a latch member in a releasing position, in accordance with the preferred embodiment of the present invention is shown. FIG. 10b shows the same operation illustrated in FIGS. 9b and 8b, but provides an alternative view of the latch spring in the fully compressed state 824. In the releasing position, the latch member beveled surface 1004 is retracted within the front bezel 708.

Referring now to FIG. 11, a diagram illustrating an assembled self-latching storage device module 208, in accordance with the preferred embodiment of the present invention is shown. FIG. 11 illustrates the other features from FIGS.

7-10, but illustrates the direction of latch spring force 1104 in the preferred embodiment. However, in other embodiments the direction of latch spring force 1104 may be opposite to that shown in FIG. 11.

Finally, those skilled in the art should appreciate that they can readily use the disclosed conception and specific embodiments as a basis for designing or modifying other structures for carrying out the same purposes of the present invention without departing from the spirit and scope of the invention as defined by the appended claims.

We claim:

1. A latching device for latching a storage device module into a storage chassis, the storage chassis confining an open-ended receiving space that extends in a first direction and that receives slidably and removably the storage device module therein, the storage chassis having a wall comprising a latch hole that borders the receiving space, the latching device comprising:
   a latch member having a latching end portion and a spring end portion opposite the latching end portion, the latch member slidingly disposed within a front bezel of the storage device module and being movable in a second direction transverse to the first direction between a latching position, and a releasing position,
   wherein the latching end portion of the latch member in the latching position extends into the latch hole for locking the storage device module into the storage chassis, wherein the latching end portion of the latch member in the releasing position is extracted from the latch hole thereby permitting the removal of the storage device module from the receiving space; and
   a latch spring for providing spring force in the second direction and disposed within the front bezel between a bearing surface of the front bezel and the spring end portion of the latch member, wherein the latch spring is in increased compression when the latch member transitions from the latching position to the releasing position, wherein the spring member is in decreased compression when the latch member transitions from the releasing position to the latching position.

2. The latching device of claim 1, wherein a rear surface of the latching end portion is beveled to cause the latch member to transition from the latching position to the releasing position after the storage device module is inserted a first predetermined distance into the receiving space.

3. The latching device of claim 2, wherein after inserting the storage device module the first predetermined distance into the receiving space, the latch member transitions from the releasing position to the latching position when the storage device module is fully inserted into the receiving space.

4. The latching device of claim 3, wherein the storage device module comprises a storage device, wherein an electrical connector of the storage device makes electrical connection with a mating connector of the storage chassis when the storage device module is fully inserted into the receiving space.

5. The latching device of claim 4, wherein the latching end portion is registered with the latch hole when the storage device module is fully inserted into the receiving space.

6. The latching device of claim 1, wherein an ejection spring exerts force in the first direction between the storage chassis and storage device module when the storage device module is fully inserted into the receiving space.

7. The latching device of claim 6, wherein the ejection spring moves the storage device module a second predetermined distance out from the receiving space when the latch member transitions from the latching position to the releasing position after the storage device module is fully inserted into the receiving space.

8. The latching device of claim 7, wherein after the ejection spring moves the storage device module the second predetermined distance out from the receiving space, a bezel finger recess of the front bezel of the storage device module allows a user to fully remove the storage device module from the receiving space.

9. A storage device module for providing independent insertion and removal of a storage device in a storage chassis, the storage device module comprising:
   a tray, slidingly engaged in a first direction to one or more storage chassis surfaces forming a receiving space that receives the storage device module therein; and
   a bezel, forming a front surface of the storage device module and fastened to the tray, the bezel comprising:
      a latch member, comprising:
         a latching end portion; and
         a spring end portion, opposite the latching end portion, the latch member being finger-movable in a second direction transverse to the first direction between a latching position, and a releasing position; and
      a latch spring for providing force in the second direction and disposed within the bezel between a bearing surface of the bezel and the spring end portion of the latch member,
   wherein in the latching position the latching end portion of the latch member extends through a latch hole in one of the one or more storage chassis surfaces for locking the storage device module into the storage chassis, wherein in the releasing position the latching end portion of the latch member is not engaged with the latch hole, wherein the latch member in the releasing position unlocks the storage device module from the storage chassis and permits the removal of the storage device module from the receiving space, wherein the latch spring is in an increased compression state when the latch member transitions from the latching position to the releasing position, wherein the latch spring is in an decreased compression state when the latch member transitions from the releasing position to the latching position,
   wherein an ejection spring exerts force in the first direction between the storage chassis and storage device module when the storage device module is fully inserted into the receiving space, wherein the ejection spring moves the storage device module a second predetermined distance out from the receiving space when the latch transitions from the latching position to the releasing position after the storage device module is fully inserted into the receiving space, wherein after the ejection spring moves the storage device module the second predetermined distance out from the receiving space, a bezel finger recess of the storage device module allows a user to fully remove the storage device module from the receiving space.

10. The storage device module of claim 9, wherein a rear surface of the latching end portion is beveled to cause the latch to transition from the latching position to the releasing position when the storage device module is inserted a first predetermined distance into the receiving space.

11. The storage device module of claim 10, wherein after inserting the storage device module the first predetermined distance into the receiving space, the latch member transitions from the releasing position to the latching position when the storage device module is fully inserted into the receiving space.

12. The storage device module of claim 11, wherein the storage device module comprises a storage device, wherein an electrical connector of the storage device makes electrical connection with a mating connector of the storage chassis when the storage device module is fully inserted into the receiving space.

13. The storage device module of claim 12, wherein the latching end portion is registered with the latch hole when the storage device module is fully inserted into the receiving space.

14. The storage device module of claim 9, wherein an ejection spring exerts force in the first direction between the storage chassis and storage device module when the storage device module is fully inserted into the receiving space.

15. The storage device module of claim 14, wherein the ejection spring moves the storage device module a second predetermined distance out from the receiving space when the latch transitions from the latching position to the releasing position after the storage device module is fully inserted into the receiving space.

16. The storage device module of claim 15, wherein after the ejection spring moves the storage device module the second predetermined distance out from the receiving space, a bezel finger recess of the storage device module allows a user to fully remove the storage device module from the receiving space.

17. A method for inserting a storage device module into a receiving space of a storage chassis, comprising:
   positioning the storage device module in alignment with the receiving space such that a front bezel assembly of the storage device module is oriented on a side of the storage device module opposite the receiving space and a top surface of the storage device module faces the top of the receiving space;
   moving the storage device module a first predetermined distance into the receiving space until a latching end portion of a latch member in the front bezel assembly makes contact with a side surface of the storage chassis, the latch member comprising the latching end portion and a spring end portion opposite the latching end portion; and
   pushing the storage device module fully into the receiving space, wherein the latching end portion engages a latch hole in a side interior surface of the storage chassis bordering the receiving space of the storage chassis when the storage device module is fully pushed into the receiving space.

18. The method for inserting a storage device module into a receiving space of a storage chassis of claim 17, the front bezel assembly comprising:
   a front bezel;
   the latch member; and
   a latch spring;
   wherein the latch spring is disposed within the front bezel between a bearing surface of the front bezel and the spring end portion of the latch member and exerts force against the spring end portion of the latch member, wherein the latch spring is in an increased compression state when the latch member transitions from the latching position to the releasing position, wherein the latch spring is in an decreased compression state when the latch member transitions from the releasing position to the latching position.

19. A method for removing a storage device module from a receiving space of a storage chassis, comprising:
   sliding a latch member in a second direction, the latch member comprising a latching end portion and a spring end portion opposite the latching end portion, wherein the latching end portion engages a latch hole in a storage chassis interior surface bordering the receiving space prior to sliding the latch member, wherein the latching end portion disengages the latch hole while sliding the latch member, wherein a latch spring in contact with the spring end portion provides a force opposite to the second direction;
   pushing the storage device module out of the receiving space by an ejection spring providing force in a first direction between the storage chassis and the storage device module and orthogonal to the second direction, wherein the ejection spring pushes the storage device module in the first direction after the latching end portion disengages the latch hole;
   grabbing the storage device module by a bezel finger recess of a front bezel assembly, wherein the front bezel assembly forms a front surface of the storage device module; and
   pulling the storage device module from the receiving space of the storage chassis.

20. The method for removing a storage device module from a receiving space of a storage chassis of claim 19, the front bezel assembly comprising:
   a front bezel;
   the latch member; and
   a latch spring;
   wherein the latch spring is disposed within the front bezel between a bearing surface of the bezel and the spring end portion of the latch member and exerts force against the spring end portion of the latch member, wherein the latch spring is in an increased compression state when the latch member transitions from the latching position to the releasing position, wherein the latch spring is in an decreased compression state when the latch member transitions from the releasing position to the latching position.

21. A method for inserting a storage device module into a receiving space of a storage chassis, comprising:
   positioning the storage device module in alignment with the receiving space, the storage device module comprising:
      a tray, slidingly engaged in a first direction to one or more storage chassis surfaces forming the receiving space; and
      a bezel, forming a front surface of the storage device module and fastened to the tray, the bezel comprising:
         a latch member, comprising:
            a latching end portion; and
            a spring end portion, opposite the latching end portion, the latch member being finger-movable in a second direction transverse to the first direction between a latching position and a releasing position;
         a latch spring for providing force opposite to the second direction and disposed within the bezel between a bearing surface of the bezel and the spring end portion of the latch member, wherein the latch spring is in an increased compression state when the latch member transitions from the latching position to the releasing position, wherein the latch spring is in a decreased compression state when the latch member transitions from the releasing position to the latching position; and
a bezel finger recess in at least one of the top and bottom surfaces of the bezel, for providing finger purchase when inserting the storage device module into the receiving space;

moving the storage device module a first predetermined distance into the receiving space until the latching end portion of the latch member makes contact with a side surface of the storage chassis; and pushing the storage device module fully into the receiving space, wherein the latching end portion engages a latch hole in a side interior surface of the storage chassis bordering the receiving space when the storage device module is fully pushed into the receiving space, wherein in the latching position the latching end portion of the latch member extends through the latch hole, wherein in the releasing position the latching end portion of the latch member is not engaged with the latch hole, wherein an ejection spring exerts force in the first direction between the storage chassis and storage device module when the storage device module is fully inserted into the receiving space.

22. A method for removing a storage device module from a receiving space of a storage chassis, comprising:

sliding a latch member of the storage device module in a second direction, the storage device module comprising:
a tray, slidingly engaged to one or more storage chassis surfaces forming the receiving space; and
a bezel, forming a front surface of the storage device module and fastened to the tray, the bezel comprising:
the latch member, comprising:
a latching end portion, wherein the latching end portion engages a latch hole in a storage chassis interior surface bordering the receiving space prior to sliding the latch member, wherein the latching end portion disengages the latch hole while sliding the latch member; and
a spring end portion, opposite the latching end portion, the latch member being finger-movable in the second direction transverse to the first direction between a latching position and a releasing position;
a latch spring for providing force opposite to the second direction and disposed within the bezel between a bearing surface of the bezel and the spring end portion of the latch member, wherein the latch spring is in an increased compression state when the latch member transitions from the latching position to the releasing position, wherein the latch spring is in a decreased compression state when the latch member transitions from the releasing position to the latching position; and
a bezel finger recess in at least one of the top and bottom surfaces of the bezel, for providing finger purchase when removing the storage device module from the receiving space;

pushing the storage device module out of the receiving space by an ejection spring providing force in a first direction transverse to the second direction between the storage chassis and the storage device module, wherein the ejection spring pushes the storage device module in the first direction after the latching end portion disengages the latch hole;

grabbing the storage device module by the bezel finger recess; and pulling the storage device module from the receiving space of the storage chassis, wherein in the releasing position the latching end portion of the latch member is not engaged with the latch hole, wherein the latch member in the releasing position unlocks the storage device module from the storage chassis and permits the removal of the storage device module from the receiving space, wherein the ejection spring moves the storage device module a predetermined distance out from the receiving space when the latch transitions from the latching position to the releasing position after the storage device module is fully inserted into the receiving space, wherein after the ejection spring moves the storage device module the predetermined distance out from the receiving space, the bezel finger recess allows a user to fully remove the storage device module from the receiving space.

* * * * *